United States Patent
Takekoshi

(10) Patent No.: US 7,716,824 B2
(45) Date of Patent: May 18, 2010

(54) METHOD OF MANUFACTURING A PROBE CARD

(75) Inventor: Kiyoshi Takekoshi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 11/995,276

(22) PCT Filed: Jul. 11, 2006

(86) PCT No.: PCT/JP2006/313738

§ 371 (c)(1),
(2), (4) Date: Mar. 3, 2008

(87) PCT Pub. No.: WO2007/007736

PCT Pub. Date: Jan. 18, 2007

(65) Prior Publication Data

US 2009/0144971 A1    Jun. 11, 2009

(30) Foreign Application Priority Data

Jul. 13, 2005    (JP) ............................. 2005-203892

(51) Int. Cl.
*H01R 9/00* (2006.01)
*G01R 31/02* (2006.01)

(52) U.S. Cl. ............................. 29/842; 29/830; 29/843; 29/844; 29/845; 324/754; 324/758

(58) Field of Classification Search .................. 29/830, 29/842, 843, 844, 845; 324/754, 758
See application file for complete search history.

(56) References Cited

U.S. PATENT DOCUMENTS

| 6,523,255 | B2* | 2/2003 | Shih et al. ...................... 29/843 |
| 7,049,837 | B2* | 5/2006 | Kasukabe et al. ............ 324/754 |
| 7,482,821 | B2* | 1/2009 | Ishikawa et al. ............. 324/754 |
| 7,514,944 | B2* | 4/2009 | Smith et al. .................. 324/754 |
| 2004/0222808 | A1* | 11/2004 | Strom et al. ................. 324/758 |
| 2005/0046431 | A1* | 3/2005 | Kirby .......................... 324/754 |

(Continued)

FOREIGN PATENT DOCUMENTS

JP    4-314344 A    11/1992

(Continued)

OTHER PUBLICATIONS

International Search Report for application PCT/JP2006/313738 dated Sep. 19, 2006.

*Primary Examiner*—C. J Arbes
(74) *Attorney, Agent, or Firm*—Pearne & Gordon LLP

(57) ABSTRACT

An object of the present invention is to finely conduct an inspection of high integration devices by making it possible to form guide holes in a support plate of a probe card in a narrower pitch than in the conventional case of forming the guide holes in a support plate of the same area, and to broaden a range of options for an elastic member which works to urge a probe pin. The present invention has a circuit board and a support plate being placed under the circuit board and supporting the probe pin. In the guide hole formed in the support plate, the probe pin composed of an elastic portion and a pin portion is inserted, and a rip of the pin portion protrudes downward from the support plate. The guide hole has a quadrangular horizontal sectional shape.

14 Claims, 10 Drawing Sheets

U.S. PATENT DOCUMENTS

| | | | |
|---|---|---|---|
| 2005/0280428 A1* | 12/2005 | Ishikawa et al. | 324/754 |
| 2006/0006889 A1* | 1/2006 | Smith et al. | 324/754 |
| 2006/0186905 A1* | 8/2006 | Kohashi et al. | 324/754 |
| 2007/0103178 A1* | 5/2007 | Kasukabe et al. | 324/754 |

FOREIGN PATENT DOCUMENTS

| | | |
|---|---|---|
| JP | 10-038920 A | 2/2002 |
| JP | 2002-062315 A | 2/2002 |
| JP | 2003-194851 A | 7/2003 |
| JP | 2003-240801 A | 8/2003 |

* cited by examiner (a)

(b)

(c)

(d)

METHOD OF MANUFACTURING A PROBE CARD

TECHNICAL FIELD

The present invention relates to a probe card.

BACKGROUND ART

Inspection of electric properties of an electronic circuit such as IC LSI and the like foamed on a semiconductor wafer, for example, is performed using a probe card attached to a probe device. A so-called pogo-pin type probe card normally has a support plate called a contactor or a guide plate which supports a large number of needle-shaped probe pins, and a circuit board connected electrically to the support plate. Tine support plate is placed so that a lower surface from which tip contact portions of the probe pins are protruded faces a wafer, and the circuit board is stacked and placed on an upper surface of the support plate. Inspection of electric properties of a device on the wafer is performed by bringing the plurality of tip contact portions of the probe pins into contact with electrodes of an electronic circuit on the device, and applying an electrical signal for testing from the respective probe pins to the electrodes via the circuit board.

The probe pins are respectively housed in a large number of guide holes formed in the support plate in a vertically slidable manner, urged by spiral-shaped coil springs attached following pin portions, and the tip contact portions of the pin portions protrude from the lower surface of the support plate. Conventionally, the guide hole has a horizontal section of a circular shape (Patent Document 1).

[Patent Document 1]
Japanese Patent Application Laid-open No. 2004-156969

DISCLOSURE OF THE INVENTION

Problems to be Solved by the Invention

However, when the guide hole has a circular horizontal sectional shape, it is impossible to deal with high integration devices of recent years. Specifically, in order to narrow a pitch between the guide holes each having a circular shape, it is necessary to make diameters of the holes extremely small, especially when the hole is fine one, since the minimum required intervals of partition walls between the circular holes which are required for a hole forming process do not change irrespective of the diameter of the hole. However, there are limits in performing a finer hole forming process and miniaturizing the pogo-pins, and further, although trying to correspond to the high integration, there is also a limit in narrowing the pitch between the adjacent probe pins. Improvements are expected regarding this point.

Besides, the coil spring used as an elastic member is suitable to be housed in the circular guide hole, but, the whole length becomes inevitably long and an inductance accordingly becomes large, which is not favorable for a weak inspection signal and is disadvantageous for a fine measurement. Further, it cannot be denied that the coil spring tends to pick up peripheral noises. To avoid these problems, the pogopin must be formed in a large structure, which eliminates the possibilities to deal with the high integration.

The present invention has been developed in consideration of the above points and an object thereof is to form a larger number of guide holes in the support plate than in the conventional case of forming the guide holes in the support plate of the same area, and broaden a range of options for the elastic member which works to urge the probe pin, to thereby finely conduct the inspection of the high integration devices.

Means for Solving the Problems

To achieve the above object, the present invention is a probe card for inspecting electric properties of an object to be inspected, the probe card having: a circuit board; and a support plate being placed under the circuit board and supporting a probe pin, in which the probe pin having an elastic portion and a pin portion is inserted in a guide hole formed in the support plate, a tip of the pin portion protrudes downward from the support plate, and the guide hole is formed to have a quadrangular horizontal sectional shape.

Since the horizontal sectional shape of the guide hole in which the probe pin is inserted is made to be quadrangular, compared to the conventional circular-shaped one, it is possible to form the adjacent guide holes in a narrower pitch. Besides, the horizontal sectional shape inside of the guide hole is quadrangular, so that a wave-form spring can be used, for example, which means that the elastic member being thicker and having a shorter whole length than the coil spring and thus having a smaller inductance can be adopted.

The guide hole may be structured to have a step portion at a lower portion thereof, and the probe pin may be designed to have a stopper stopped in the step portion. Further, the probe pin may be structured to have the stopper stopped in an upper end portico of the guide hole, or to have a stopper Stopped in a lower end portion of the guide hole. Furthermore, the guide hole may be designed to have an upper guide hole and a lower guide hole following thereto having a large hole diameter, and a vertical probe pin may have stoppers stopped on edge peripheral portions between the upper guide hole and the lower guide hole.

The guide holes can be formed in a region in a narrower pitch than in the conventional case of forming the guide holes in a region of the same area by making the horizontal sectional shape of the guide hole particularly rectangular. For instance, the rectangular holes of 50 μm×100 μm can be formed in tandem in a pitch of 100 μm.

Meanwhile, since the guide hole is made to have a quadrangular horizontal sectional shape, there is generated a need for forming fine and deep holes in the support plate being a substrate for inserting the probe pins. As a material for the support plate, the one having an insulation property such as a polyimide-type resin and ceramics is conventionally adopted. However, it is difficult to perform a commonly used drilling process to these conventional materials when forming a fine guide hole having a quadrangular horizontal sectional shape, and further, even with the use of other machining processes such as an ultrasonic process, a blast process and the like, or a laser process, it is quite difficult to form the fine and deeper guide hole having the quadrangular shape with high positional and dimensional accuracy.

Accordingly, in the present invention, as a material of the support plate, a glass substrate made of borosilicate glass which is represented by Pyrex glass (registered trademark of the Corning Company in U.S.), for example, is applied, and further, the guide holes being used are formed by the following steps.

Specifically, at first, a plurality of holes are formed in a pin stand substrate by an etching, and pitas are stood in the plurality of holes formed in the pin stand substrate. Subsequently, the glass substrate is housed in a container having an opened upper surface, and the pin stand substrate is placed opposite the glass substrate so that the pins of the pin stand substrate face a side of the glass substrate housed in the container.

Next, the glass substrate housed in the container is heated to be melted, the pin stand substrate is approximated to the melted glass substrate, and the pins of the pin stand substrate are inserted into the glass substrate. Subsequently, the glass substrate housed in the container is cooled and solidified while having the pins inserted therein. After that, the glass substrate is taken out from the container, and the pins inserted in the glass substrate are removed. Subsequently, a lower surface of the glass substrate where the pins are removed therefrom is polished, to thereby form the guide holes.

The step of inserting the pins into the glass substrate may be performed by lowering the pin stand substrate in a predetermined speed using a raisable/lowerable holding member holding the glass substrate.

The pin stand substrate can be formed of a silicon substrate. Further, the container may be made of carbon. For the carbon, the one having an excellent thermal conductivity and a thermal expansion coefficient substantially the same as that of the borosilicate glass is used. Accordingly, it is possible to effectively transmit the heat of the container to the glass substrate at a time of heating. Further, the carbon has gaps between its particles, so that a bubble inside of the glass substrate tends to be escaped therethrough. Besides, since the carbon does not adhere to the glass substrate, the glass substrate can be easily taken out from the container. The pins are preferable to be made of a material possessing a heat resistance to a heating temperature of the glass substrate.

In order to remove the pins, liquid, for example may be used to dissolve the pins to remove them from the glass substrate. In such a case, the pins may be made of metal, and an aqua regia may be adopted as the liquid, for example. As a material for the pin, for instance, tungsten, stainless steel, molybdenum, nickel or nickel alloy can be used.

Effect of the Invention

According to the present invention, it is possible to farm guide holes in a region in a narrower pitch than in the conventional case of forming the guide holes in a region of the same area, since the guide holes are made to have quadrangular sectional shapes. Besides, a range of options for the shapes of an elastic member becomes broader, which makes it possible to use the elastic member being thick and short in length, and to perform a signal transmission under the circumstance of small inductance.

BRIEF DESCRIPTION OF THE DRAWINGS

[FIG. 14]
Explanatory views showing steps for forming the guide holes in a glass substrate, in which
FIG. 14(a) shows a state in which the silicon substrate is attached to a holding member,
FIG. 14(b) shows a state in which the glass substrate is melted,
FIG. 14(c) shows a state in which the pins are inserted into the melted glass substrate,
and FIG. 14(d) shows a state in which a suction of the glass substrate by the holding member is released.
[FIG. 15]
Views showing the steps for forming the guide holes in the glass substrate following FIG. 14, in which
FIG. 15(a) shows a state in which the glass substrate is taken out from a container,
FIG. 15(b) shows a state in which the silicon substrate and the pins are removed,
and FIG. 15(c) shows a state in which a lower surface of the glass substrate is polished to thereby complete the formation of the guide holes.

Figure 1:
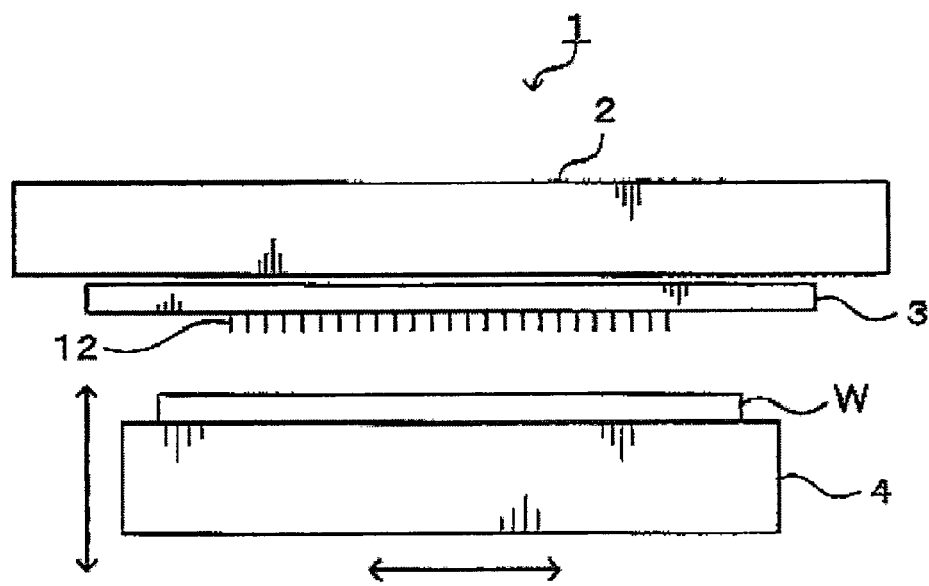
[FIG. 1]
An side view of a probe card according to an embodiment.

EXPLANATION OF CODES 1 probe card
2 circuit board
3 support plate
5 guide hole
6 protrusion
11 probe pin
12 pin portion
13 elastic portion
14 stopper

BEST MODE FOR CARRYING OUT THE INVENTION

Hereinafter, a preferred embodiment of the present invention will be described, FIG. 1 shows an outline of a side surface of a probe card 1 according to the present embodiment. The probe card 1 is provided with a circuit board 2 and a support plate 3 placed on a lower surface of the circuit board 2. Note that the whole of the probe card 1 is supported by a probe device (not shown) so that the probe card 1 faces a wafer W being an object to be inspected placed on a mounting table 4 and therefore the probe card 1 and the wafer W become parallel to each other.

Figure 2:
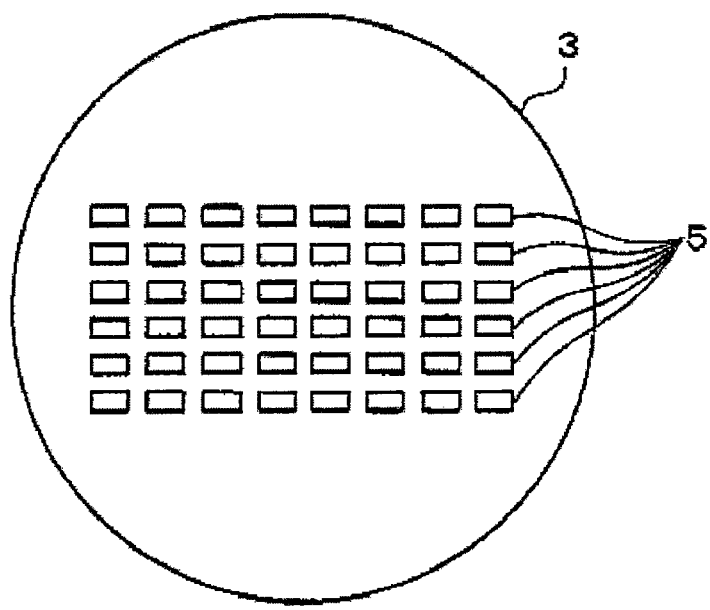
[FIG. 2]
A plan view of a support plate used in the probe card of FIG. 1.
Figure 3:
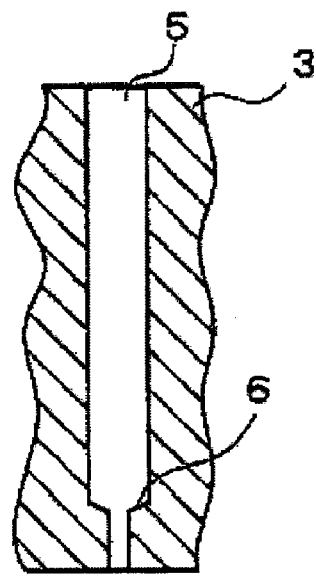
[FIG. 3]
A longitudinal sectional view of a guide hole.

The support plate 3 is made of a glass plate and is formed in a substantially disk-shape, as a whole, as shown in FIG 2. In a central portion of the support plate 3 feeing the wafer W on the mounting table 3, a plurality of guide holes 5 each having a rectangular horizontal section are formed. At a lower portion inside each of the guide holes 5, a step portion 6 is formed, as shown in FIG. 3.

Figure 4:
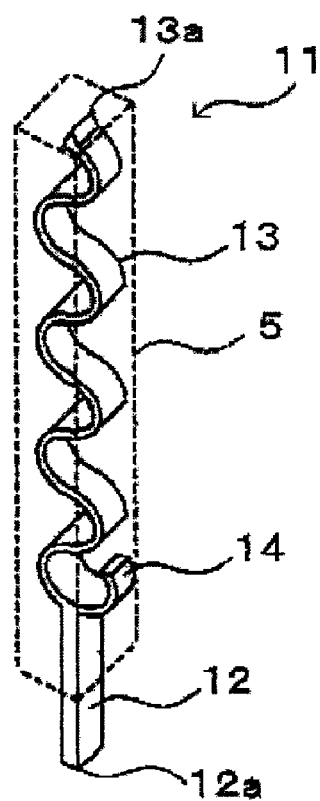
[FIG. 4]
A perspective view of a probe pin.
Figure 5:
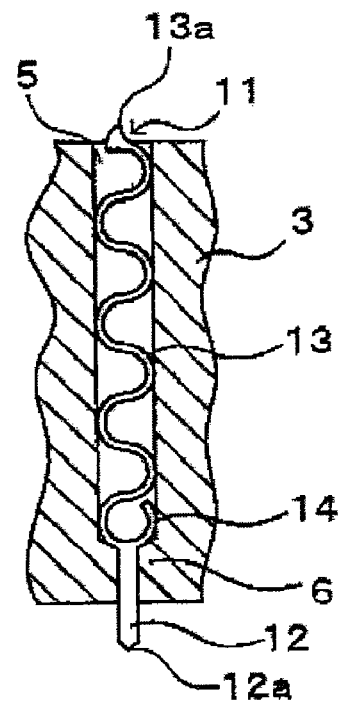
[FIG. 5]
A longitudinal sectional view of the guide hole showing a state in which the probe pin of FIG. 4 is inserted in the guide hole.

A probe pin 11 shown in FIG. 4 is inserted into the guide hole 5. The probe pin 11 has a structure in which a pin portion 12 being a lower portion and an elastic portion 13 being an upper portion are integrally united. The elastic portion 13 is formed in a band shape with a wave form. At an upper end portion of the elastic portion 13, a contact portion 13a for obtaining an electrical continuity by contacting with a predetermined contact portion on the circuit board is formed. A lower end portion of the elastic portion 13 is formed in a substantially C-shape, and a central portion at a lower end thereof is provided with the pin portion 12. The portion formed in the substantially C-shape composes a stopper 14. Therefore, when the probe pin 11 is inserted into the guide hole 5, the step portion 6 functions as a stopper to lock the stopper 14, resulting that only a lower portion of the pin portion 12 protrudes from a lower surface of the guide hole 5, as shown in FIG. 5. On the other hand, from an upper surface of the guide hole 5, the contact portion 13a of the elastic portion 13 is protruded.

Figure 6:
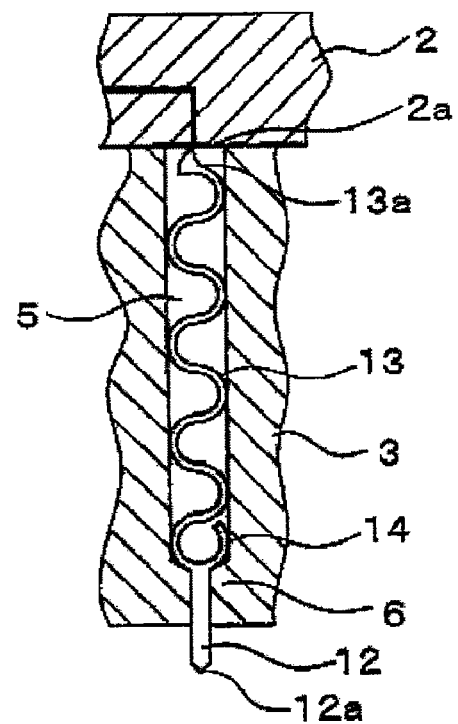
[FIG. 6]
A longitudinal sectional view of the guide hole showing a state in which the probe pin is fitted therein.
Figure 7:
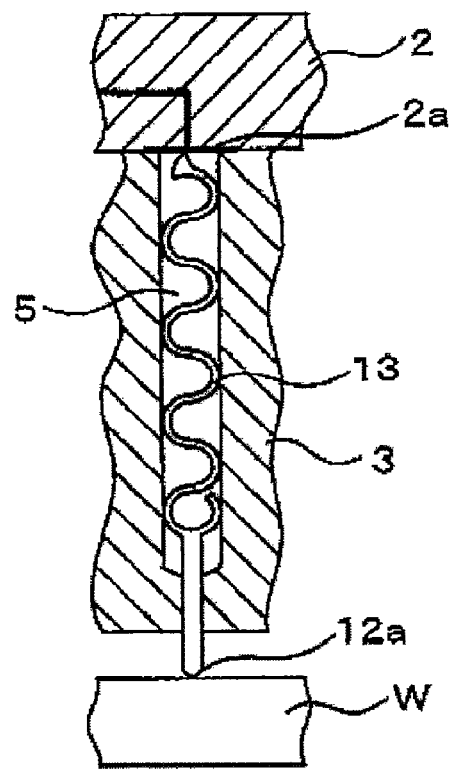
[FIG. 7]
An explanatory view showing a state in which a contact portion of the probe pin is brought into contact with an object to be inspected on a wafer.

The probe pin 11 set in the guide hole 5 as described above is structured such that the lower portion of the pin portion 12 including the contact portion 12a protrudes from the lower surface side of the support plate 3, and the contact portion 13a of the elastic portion 13 protrudes from the upper surface side of the support plate 3, to thereby contact with a predetermined contact portion 2a on the circuit board 2, as shown in FIG. 6. Subsequently, by bringing the contact portion 12a into contact with a predetermined point on the wafer W, which is, for example, an electrode portion of a manufactured device, the electrode portion and the contact portion 2a are electrically conducted to each other.

Figure 8:
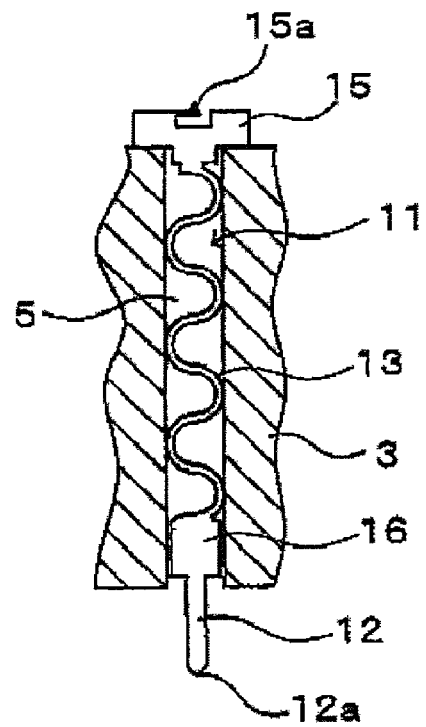
[FIG. 8]
An explanatory view of the probe pin having an elastic portion in which an upper portion thereof has a shape to be stopped on an upper end portion of the guide hole.

In the above-described example, the guide hole 5 has a shape having the step portion 6 formed at the lower portion thereof, and the stopper 14 formed at the lower portion of the elastic portion 13 is designed to be stopped on the step portion 6, but, it is also possible to adopt the guide hole 5 having a straight shape with no step portion, as shown in FIG. 8. In such a case, a stopper 15 having a shape larger ten an opening of the guide hole 5 is formed at an upper end portion of the elastic portion 13 of the probe pin 11, and a contact portion 15a contacting with the circuit board 2 is provided to an upper end portion of the stopper 15. Note that, in this case, if a guide member 16 having a rectangular parallelepiped shape corresponding to the shape of the inside of the guide hole 5 is provided between toe elastic portion 13 and the pin portion 12, the extension/contraction of the elastic portion 13 and the slide movement of the pin portion 12 can be performed smoothly, which makes it possible to have the pin portion 12 and the elastic portion 13 of the probe pin 11 stably slide inside of the guide hole 5.

Figure 9:
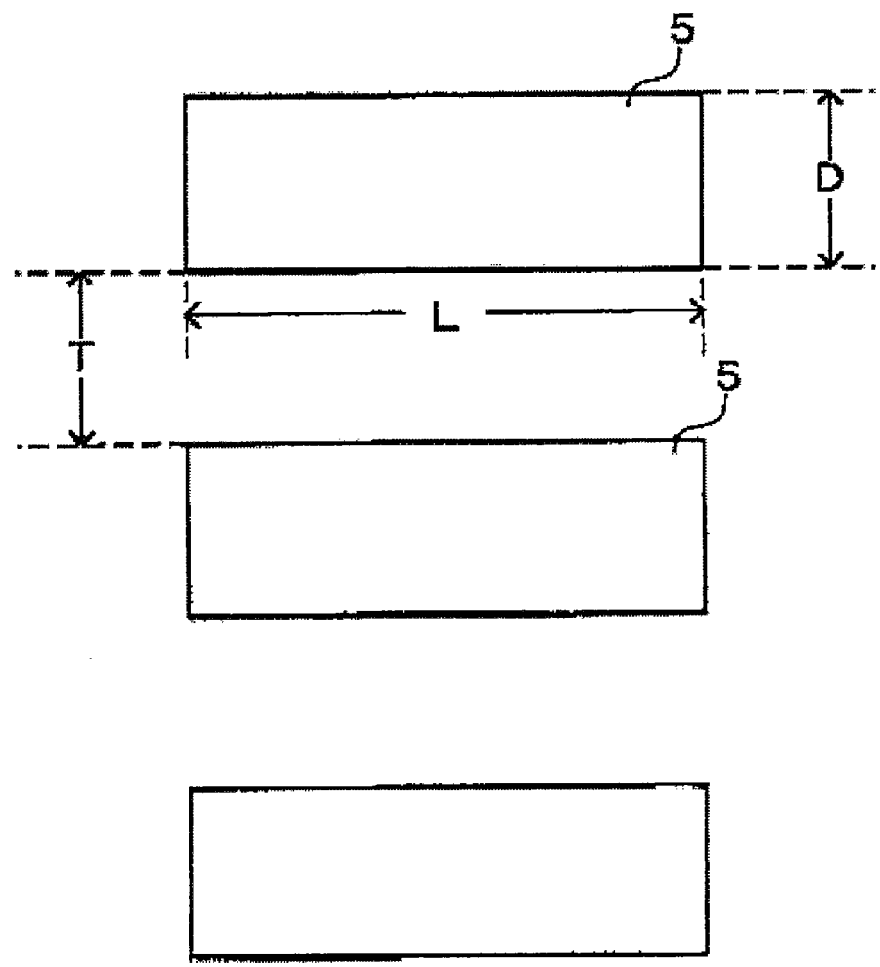
[FIG. 9]
A plan view showing a dimension of the guide hole.

The guide hole 5 according to the present embodiment has a dimension in which a wide D is 50 μm, a length L is 100 μm, an interval T between the guide holes 5 is 50 μm, and a depth is 1.5 mm, as shown in FIG. 9. It is impossible to form such a fine and deep quadrangular guide hole 5 by a conventional boring process such as a drilling, and still more, it is far more difficult to form the guide hole 5 having the step portion 6 at the lower portion thereof; as shown in FIG. 3.

Figure 10:
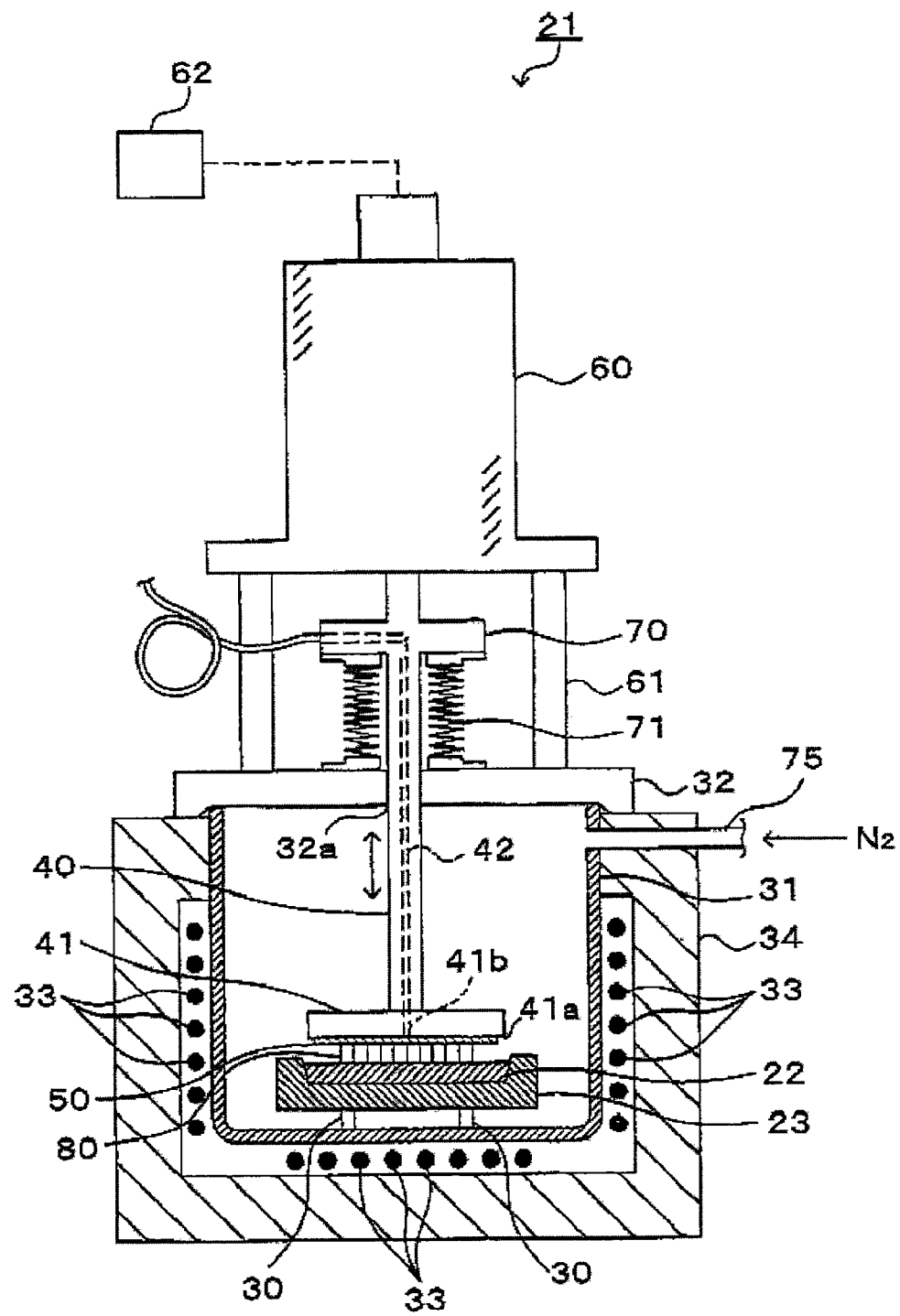
[FIG. 10]
A longitudinal sectional view showing a schematic configuration of a hole forming apparatus.

The guide holes 5 described above can be formed as follows, for example. FIG. 10 shows a schematic configuration of a hole forming apparatus 21 for forming the guide holes 5 in a glass substrate. The hole forming apparatus 21 is provided with a container 23 housing a glass substrate 22 to be a support plate 3. The container 23 is formed in a box-shape having an opened upper surface and a longitudinal section of a recessed shape. Side surfaces of the inside of the container 23 are formed in a tapered shape so that an inside diameter of the container 23 becomes gradually large from a bottom surface of the container 23 toward the opening surface thereof. The container 23 is made of a material which is not welded to the glass substrate 22, and having a linear expansion coefficient smaller than the glass substrate 22 with an excellent thermal conductivity, such as carbon. Accordingly, it can eliminate such possibilities that the glass substrate 22 housed in the container 23 is damaged due to a contraction at a time of cooling, or the glass substrate 22 cannot be taken out from the container 23 after the cooling.

The container 23 is housed in a heating container 31 while being supported by supporting members 30. The heating container 31 is formed, for example, in a substantially cylindrical shape having an opened upper surface and a closed bottom surface. The heating container 31 is made of, for example, a quartz glass. An upper surface opening portion of the hearing container 31 is closed in an air-tight state with a lid body 32. The lid body 32 is made of, for example, ceramics.

Heaters 33 generating heat when the power is supplied are placed in a periphery of the heating container 31. The heaters 33 are placed, for example, in lateral surfaces and a lower surface of the heating container 31. The heating container 31 is covered by an outer cover 34 made of a heat insulating material. The heaters 33 are interposed between the outer cover 34 and the heating container 31.

A through hole 32a penetrating vertically is formed at a central portion 20 of the lid body 32. A shaft 40 extending vertically from above the lid body 32 to the inside of the heating container 31 is inserted in the through hole 32a. The shaft 40 is made of, for example, ceramics. The shaft 40 is formed in a hollow shape, for instance.

A holding member 41 having, for example, a quadrangle plate shape with thickness is attached to a lower end portion of the shaft 40. A lower surface 41a of the holding member 41 is formed horizontally. A suction port 41b is formed on the lower surface 41a of toe holding member 41. The suction port 41b is connected to a negative pressure generating device such as a vacuum pump (not shown) via a vacuum line 42 passing through inside of the shaft 40, as shown in FIG. 1. A start/stop of the suction through the suction port 41b allows a silicon substrate 50 being a pin stand substrate shown in FIG. 11 to be attached to/detached from the lower surface 41a of the holding member 41.

An upper end portion of the shaft 40 is connected to a raising/lowering driving unit 60 such as a motor placed above the lid body 32. The raking/lowering driving unit 60 is supported on support members 61 being placed, for example, on an upper surface of the lid body 32. An operation of the raising/lowering driving unit 60 is controlled by, for instance, a control unit 62. The raising/lowering driving unit 60 vertically moves the shaft 40 to move the holding member 41 in a vertical direction, which enables the silicon substrate 50 held by the holding member 41 to be close to/apart from the glass substrate 22 housed in the container 23. A raising/lowering speed and a raised/lowered position of the silicon substrate 50 are controlled by the control unit 62.

For example, a disk-shaped flange 70 is attached to the shaft 40 between the lid body 32 and the raising/lowering driving unit 60. Between the flange 70 and toe lid body 32, expandable/contractable bellows 71 are interposed. The bellows 71 are provided with a not-illustrated cooling mechanism to control transmission of heat from a side of the heating container 31 to a side of the raising/lowering driving unit 60. Note that the vacuum line 42 is connected to the external negative pressure generating device via the flange 70.

The hole forming apparatus 21 is provided with a gas supply pipe 75 supplying a predetermined gas to the inside of the hearing container 31. The gas supply pipe 75 is connected, for example, to a side surface of the heating container 31. The gas supply pipe 75 communicates with a not-illustrated gas supply source. In the present embodiment, the gas supply source is charged with nitrogen gas, and the nitrogen gas is supplied to the inside of the heating container 31 through the gas supply pipe 75.

Next, processes of forming the guide holes using the above-described hole forming apparatus 21 will be explained. In the present embodiments a case where the guide holes 5 shown in FIG. 3 are formed in the glass substrate made of borosilicate glass such as Pyrex glass (registered trademark of the Corning Company) is explained as an example.

Figure 11:
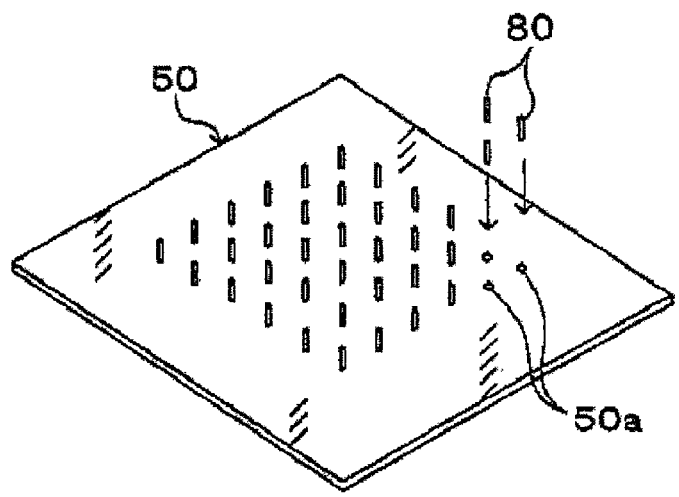
[FIG. 11]
A perspective view of a silicon substrate.
Figure 12:
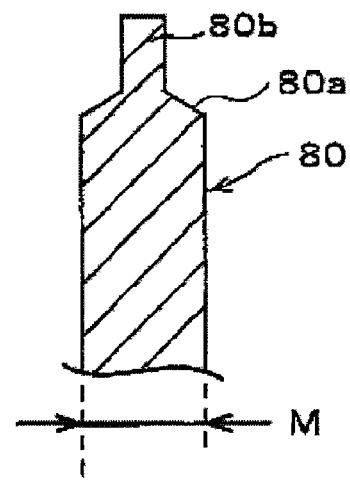
[FIG. 12]
A sectional view of a tip portion of a pin used for forming a guide hole with a step portion.

First, a plurality of square holes 50a are formed at predetermined positions of the square-shaped silicon substrate 50, as shown in FIG. 11, and quadrangular pole-shaped hole forming pins 80 are respectively inserted in each of the holes 50a. The holes 50a of the silicon substrate 50 are formed by a dry etching process of a photolithography technique. The holes 50a are formed in a pitch distance of 100 µm or smaller with a diameter of, for example, about 50 µm and are provided with positional and dimensional accuracy within 2 µm. The hole 50a is formed in a diameter slightly larger than that of the hole forming pin 80 to be inserted therein. Positions and the number of the holes 50a of the silicon substrate 50 are appropriately set in accordance with positions of the guide holes 5 to be ultimately formed in the glass substrate 22.

The hole forming pin 80 possesses a heat resistance to a temperature at, for example, later-described heating, which is 1000° C., for instance, and is made of metal such as tungsten, stainless steel, molybdenum, nickel or nickel alloy. The hole forming pin 80 is formed by cutting a metal wire, reforming cutting using a lathe and the like, or using a plating technique such as a LIGA process. The hole forming pin 80 is formed in a length of 1 mm or more, and in a dimension M of one side of a side peripheral surface of about 50 µm. Further, at a tip portion of the hole forming pin 80, a protrusion 30b adjacent to an inclined surface portion 80a is formed.

Figure 13:
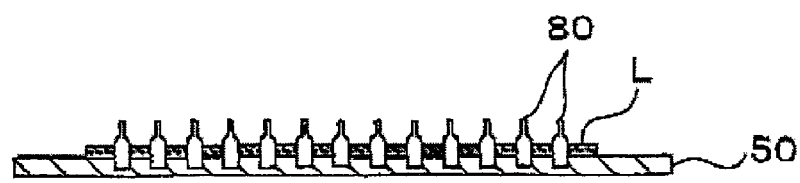
[FIG. 13]
A longitudinal sectional view of the silicon substrate having the hole forming pins fixed thereto.

An adhesive L is applied to the silicon substrate 50 when the hole forming pins 80 are inserted therein, to thereby fix the hole forming pins 80 to the silicon substrate 50, as shown in FIG. 13. Note that the fixing of the hole foaming pins 80 can be performed by, for example, a press fitting.

The silicon substrate 50 having the hole forming pins 80 fixed thereto is sucked and held on a lower surface of the holding member 41 in the hole forming apparatus 1, in a state that the hole forming pins 80 are facing downward, as shown in FIG. 1. The suction of the silicon substrate 50 is conducted by a suction through the suction port 41b.

Meanwhile, the glass substrate 22 having square and flat shape is housed hi the container 23 of the hole forming apparatus 21. When the glass substrate 22 is housed in the container 23, nitrogen gas is supplied to the inside of the heating container 31 through the gas supply pipe 75. Accordingly, the inside of the heating container 31 is maintained in a nitrogen atmosphere. At tins time, the inside of the heating container 31 is maintained in a positive pressure with respect to the outside, and the outside air is prevented from entering the inside of the heating container 31.

Figure 14:
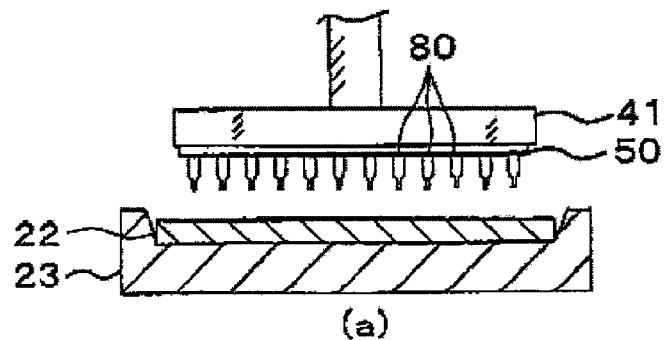
Figure 14:
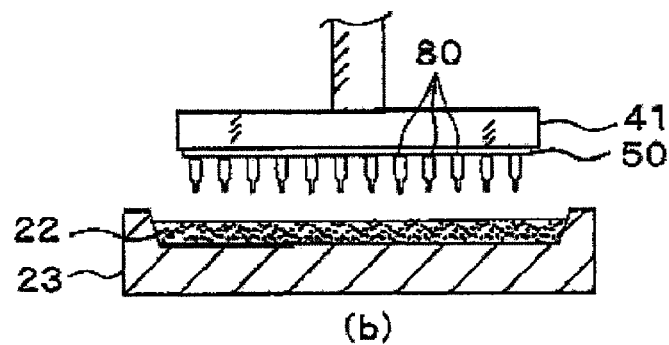
Figure 14:
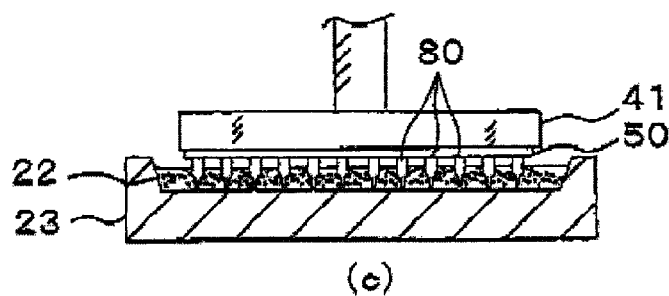
Figure 14:
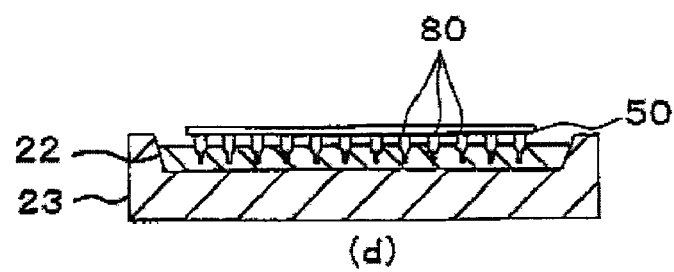

Next, the temperature of the inside of the heating container 31 is raised by the heat generated in the heaters 33, in a state that the silicon substrate 50 and the glass substrate 22 are approximated to each other, as shown in FIG. 14(a). Accordingly, the glass substrate 22 housed in the container 23 is heated to about 1000° C., which is higher than the softening temperature of the glass substrate 22. At this time, the silicon substrate 50 and the hole forming pins 80 are also heated at a temperature substantially the same as that of the glass substrate 22.

When the temperature of the glass substrate 22 is beyond its softening temperature, the glass substrate 22 starts melting (FIG. 14(b)). When the glass substrate 22 starts melting, the control unit 62 operates the raising/lowering driving unit 60 to lower the holding member 41 at a predetermined speed until it reaches a predetermined position (FIG. 14(c)), Accordingly, the hole forming pins 80 of the silicon substrate 50 are inserted into the glass substrate 22 at a predetermined depth. Thereafter, the heating by the heaters 33 is stopped, and the glass substrate 22 is cooled until the temperature reaches about 100° C. and solidified while having the hole forming pins 80 inserted therein. The cooling is performed gradually compared to the temperature fluctuation at the time of heating. Further, the cooling is conducted while the silicon substrate 50 is being held by the holding member 41.

When the glass substrate 22 is cooled to be solidified, the suction by the holding member 41 through the suction port 41b is stopped, and the holding member 41 is raised by the raking/lowering driving unit 60 and is apart from the silicon substrate 50 (FIG. 14(d)).

Next, the glass substrate 22 is taken out from the heating container 31 in a state of having the hole framing pins 80 and the silicon substrate 50 attached thereto, as shown hi FIG. 15(a), for example. Subsequently, the glass substrate 22 is immersed in liquid chemical such as, for example, an aqua regia to dissolve the hole forming pins 80 (FIG. 15(b)). Accordingly, the hole forming pins 80 and the silicon substrate 50 are removed from the glass substrate 22, thereby forming the holes 100 in an upper surface of the glass substrate 22.

Thereafter, a lower surface of the glass substrate 22 is polished, for example, to penetrate the holes 100 of the glass substrate 22. Accordingly, the desired guide holes 5 each being rectangular and having a dimension of 80 µm (long edge)×40 µm (short edge), for example, are formed in the glass substrate 22 in a pitch distance of 80 µm (FIG. 15(c)). After that, the upper surface of the glass substrate 22 is polished, if required.

According to the above-described processes, a large number of fine holes 50a having high positional and dimensional accuracy are formed in the silicon substrate 50 by the photolithography technique, and the holes 100 are formed in the glass substrate 22 by the hole forming pans 80 standing in the holes 50a. Therefore, it is possible to form fine guide holes 5 having high positional and dimensional accuracy in the glass substrate 22 as the support plate 3.

In the above example, the phi 80 having the quadrangular pole shape with the protrusion 80b formed at the tip portion thereof is used to correspond to the shape of the guide hole 5 having the step portion 6 formed therein, but, by varying the shape of the pin 80, the guide holes 5 in a variety of shapes can be formed. For instance, in order to form the guide hole 5 being straight and rectangular without step portion as shown in FIG. 8, it is only needed to make the pin 80 have, for example, straight and quadrangular pole shape.

Figure 16:
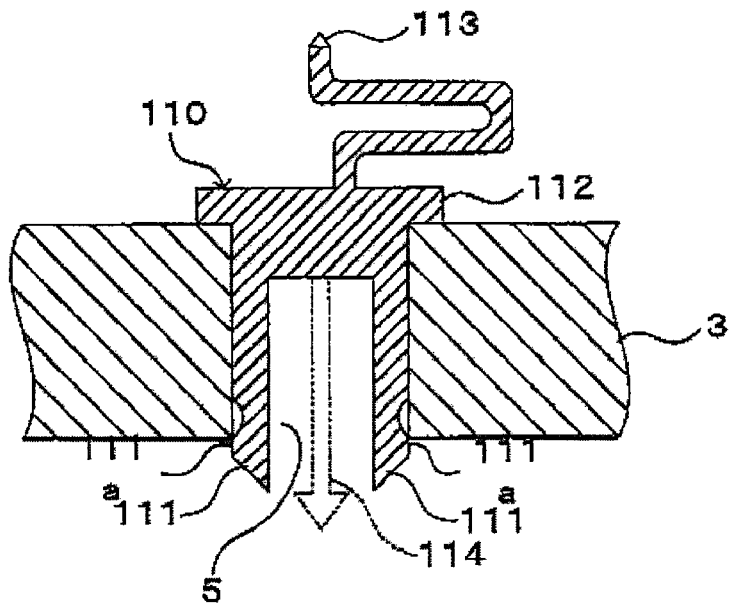
[FIG. 16]
A longitudinal sectional view showing a state in which a probe pin having stoppers stepped on upper and lower ends of the guide hole is fitted in the guide hole.

Further, when forming the guide hole 5 being straight and rectangular, by appropriately varying the length of its short edge and long edge, it becomes possible for the probe pin no having a shape as shown in FIG. 16, for instance, to be freely attached to/detached from the guide hole 5.

At a lower portion of the probe pin 110, there are provided stoppers 111 facing to each other and being stopped, for example, in lower end peripheral edges of the guide hole 5. Further, at an upper portion of the probe pin 110, there is provided a stopper 112 being stopped in an upper end peripheral edge of the guide hole 5. The stoppers 111 possess an elasticity which urges the stoppers 111 to move outward, and when locking protrusions 111a are stopped in the lower end peripheral edges of the guide hole 5 by being urged by the elasticity, it becomes possible to attach the probe pin 110 to a predetermined position of the guide hole 5. Further, when exchanging the probe pin 110, the stoppers 111 are moved inward opposing the elasticity which easily releases the engagement of toe locking protrusions 111a. Accordingly, the probe pin 110 can be pulled out above the guide hole 5. Further, by making a planer shape of the guide hole 5 rectangular, a contact portion 113 placed above the stopper 112 can also be positioned easily and correctly. Note that toe contact with the electrode portion (not shown) can be directly conducted by, for example, the stoppers 111. However, it is also possible to contact with the electrode portion by providing a pin portion 114 possessing an elasticity to a lower surface side of the stopper 112.

Figure 17:
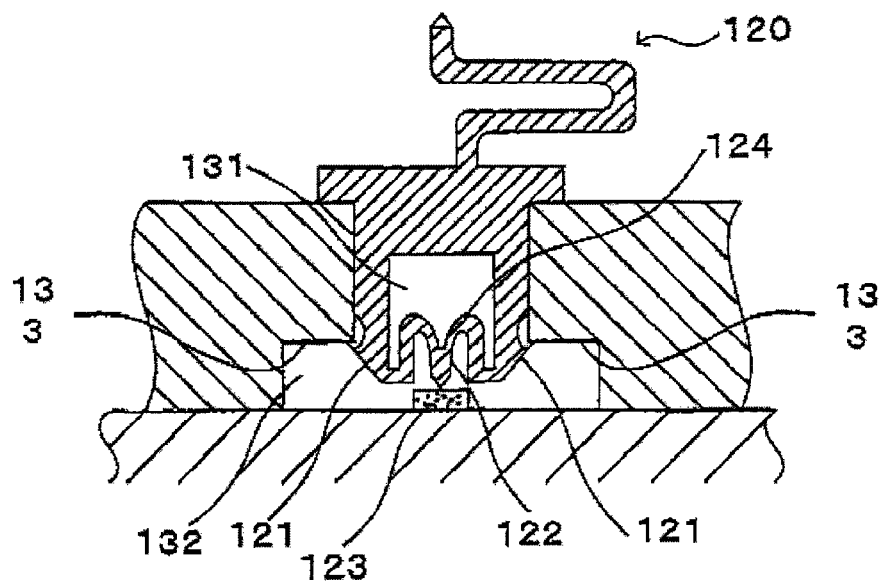
[FIG. 17]
A longitudinal sectional view showing a state in which a probe pin having stoppers stopped on upper and lower ends of a guide hole is fitted in the guide hole composed of an upper and a lower guide hole.
Figure 18:
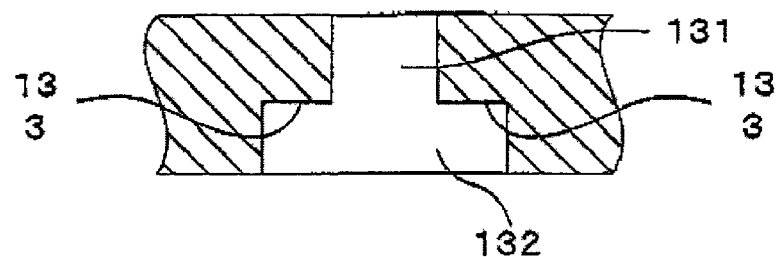
[FIG. 18]
A longitudinal sectional view of the guide hole composed of the upper and the lower guide hole.

Further, a probe pin 120 having a shape as shown in FIG. 17 can also be used. The probe pin 120 has stoppers 121 facing to each other and having shorter length than the stoppers 111 of the probe pin 110 shown in FIG. 16, and has a pin portion 122 positioned between the stoppers 121. The pin portion 122 is supported by a bridge 124 having an elasticity because of its curved structure, so that toe pin portion 122 is urged to move toward an electrode portion 123 side.

When the probe pin 120 structured as such is used, the guide hole is formed to have an upper guide hole 131 being an upper portion with a small diameter and a lower guide hole 132 being a lower portion with a large diameter, and the stoppers 121 are stopped in peripheral portions of edge portions 133 between the upper guide hole 131 and the lower guide hole 132.

Figure 15:
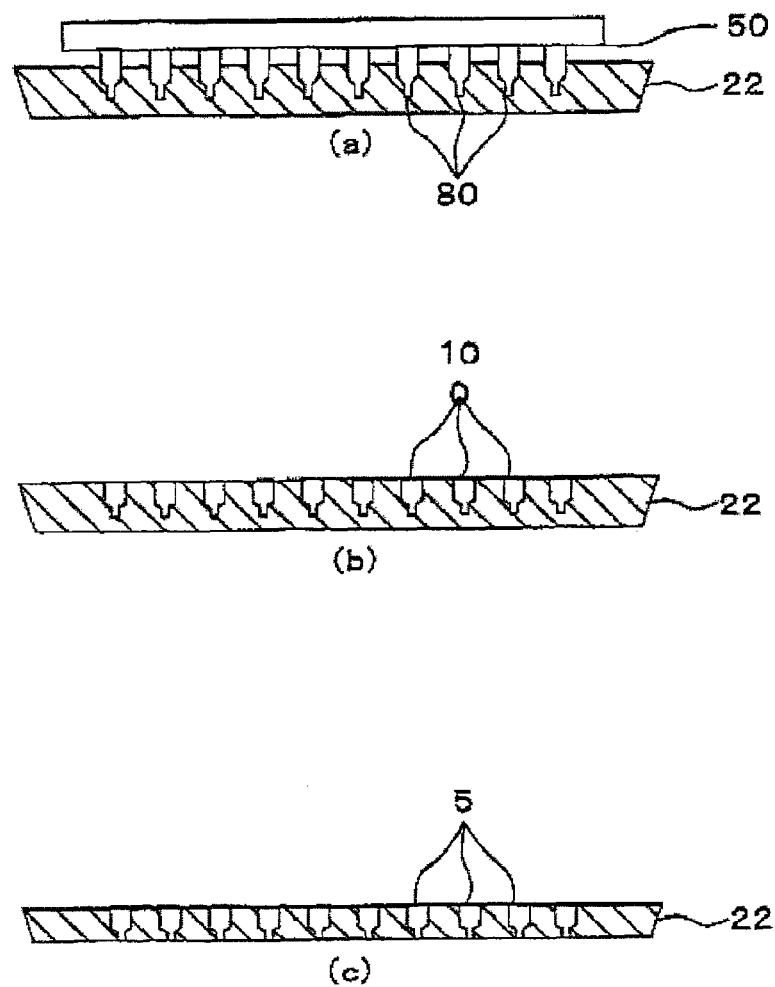

In order to form such a guide hole composed of the upper guide hole 131 and the lower guide hole 132 following thereto having a large diameter, it is only needed to use the glass substrate 22 upside down which is formed as shown in previously described FIG. 15, for example.

INDUSTRIAL APPLICABILITY

The present invention is useful for a probe card for performing inspection of electric properties of high integration electronic devices.

What is claimed is:

1. A method for manufacturing a probe card for inspecting electric properties of an object to be inspected, said probe card comprised of a circuit board; and a support plate being placed under said circuit board and being formed of a glass substrate and supporting a probe pin, the method comprising:

forming a hole in a pin stand substrate by an etching and standing a pin having a quadrangular polo shape in the hole formed in the pin stand substrate;

housing a glass substrate in a container having an opened upper surface;

placing the pin stand substrate opposite the glass substrate so that the pin of the pin stand substrate faces a side of the glass substrate housed in the container;

heating and melting the glass substrate housed in the container;

approximating the pin stand substrate to the melted glass substrate and inserting the pin of the pin stand substrate into the glass substrate;

cooling and solidifying the glass substrate housed in the container while having the pin inserted therein;

taking out the glass substrate from the container;

removing the pin inserted in the glass substrate; and forming a guide hole having a quadrangular horizontal sectional shape by polishing a lower surface of the glass substrate after the pin is removed therefrom;

wherein the probe pin composed of an elastic portion and a pin portion is inserted in the guide hole; and wherein a tip of the pin portion protrudes downward from said support plate.

2. The method according to claim 1,
wherein a step portion is formed on a lower portion inside of the guide hole; and
wherein the probe pin has a stopper stopped in the step portion.

3. The method according to claim 1,
wherein the probe pin has a stopper stopped in an upper end portion of the guide hole.

4. The method according to claim 1,
wherein the probe pin has a stopper stopped in a lower end portion of the guide hole.

5. The method according to claim 1,
wherein the guide hole is composed of an upper guide hole and a lower guide hole following thereto having a large hole diameter; and
wherein the probe pin has stoppers stopped in edge peripheral portions between the upper guide hold and the lower guide hole.

6. The method according to claim 1,
wherein the quadrangular shape is a rectangular shape.

7. The method according to claim 1,
wherein the step of inserting the pin into the glass substrate is performed by lowering the pin stand substrate in a predetermined speed using a raisable/lowerable holding member holding the pin stand substrate.

8. The method according to claim 1,
wherein the pin stand substrate is also heated at the step of heating the glass substrate housed in the container.

9. The method according to claim 1,
wherein the pin stand substrate is a silicon substrate.

10. The method according to claim 1,
wherein the container is made of carbon.

11. The method according to claim 1,
wherein the pin is made of a material possessing a heat resistance to a heating temperature of the glass substrate.

12. The method according to claim 1,
wherein the pin is dissolved in liquid to be removed from the glass substrate.

13. The method according to claim 12,
wherein the pin is made of metal and the liquid is an aqua regia.

14. The method according to claim 13,
wherein the pin is made of tungsten, stainless steel, molybdenum, nickel or nickel alloy.

* * * * *

UNITED STATES PATENT AND TRADEMARK OFFICE
CERTIFICATE OF CORRECTION

| | | |
|---|---|---|
| PATENT NO. | : 7,716,824 B2 | Page 1 of 1 |
| APPLICATION NO. | : 11/995276 | |
| DATED | : May 18, 2010 | |
| INVENTOR(S) | : Kiyoshi Takekoshi | |

It is certified that error appears in the above-identified patent and that said Letters Patent is hereby corrected as shown below:

On the Title page, item (54) and column 1, line 1, please replace "METHOD OF MANUFACTURING A PROBE CARD" with -- PROBE CARD --

On the Title page, item (57), line 13, please replace the sentence "portion is inserted, and a rip of the pin portion protrudes" with -- portion is inserted, and a tip of the pin portion protrudes --

In the specification, column 2, line 29, replace "Stopped" with -- stopped --

In the specification, column 2, line 63, replace "pitas" with -- pins --

In the specification, column 3, line 40, replace "farm" with -- form --

In the specification, column 5, line 5, replace "described," with -- described. --

In the specification, column 5, line 16, replace "feeing" with -- facing --

In the specification, column 5, line 58, replace "ten" with -- than --

In the specification, column 6, line 11, replace "thereof;" with -- thereof, --

In the specification, column 6, line 36, replace "hearing" with -- heating --

In the specification, column 6, line 47, remove "20"

In the specification, column 6, line 66, replace "raking/lowering" with -- raising/lowering --

Signed and Sealed this
Third Day of May, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,716,824 B2 | Page 1 of 2 |
| APPLICATION NO. | : 11/995276 | |
| DATED | : May 18, 2010 | |
| INVENTOR(S) | : Kiyoshi Takekoshi | |

It is certified that error appears in the above-identified patent and that said Letters Patent is hereby corrected as shown below:

On the Title page, item (54) and column 1, line 1, please replace "METHOD OF MANUFACTURING A PROBE CARD" with -- PROBE CARD --

On the Title page, item (57), line 13, please replace the sentence "portion is inserted, and a rip of the pin portion protrudes" with -- portion is inserted, and a tip of the pin portion protrudes --

In the specification, column 2, line 29, replace "Stopped" with -- stopped --

In the specification, column 2, line 63, replace "pitas" with -- pins --

In the specification, column 3, line 40, replace "farm" with -- form --

In the specification, column 5, line 5, replace "described," with -- described. --

In the specification, column 5, line 16, replace "feeing" with -- facing --

In the specification, column 5, line 58, replace "ten" with -- than --

In the specification, column 6, line 11, replace "thereof;" with -- thereof, --

In the specification, column 6, line 36, replace "hearing" with -- heating --

In the specification, column 6, line 47, remove "20"

In the specification, column 6, line 66, replace "raking/lowering" with -- raising/lowering --

This certificate supersedes the Certificate of Correction issued May 3, 2011.

Signed and Sealed this
Fourteenth Day of June, 2011

David J. Kappos
*Director of the United States Patent and Trademark Office*

CERTIFICATE OF CORRECTION (continued)
U.S. Pat. No. 7,716,824 B2

In the specification, column 7, line 55, replace "30b" with -- 80b --

In the specification, column 7, line 60, replace "foaming" with -- forming --

In the specification, column 8, line 2, replace "hi" with -- in --

In the specification, column 8, line 39, replace "raking/lowering" with -- raising/lowering --

In the specification, column 8, line 43, replace "hi" with -- in --

In the specification, column 8, line 65, replace "phi" with -- pin --

In the specification, column 9, line 8, replace "no" with -- 110 --

In the specification, column 9, line 23, replace "toe" with -- the --

In the specification, column 9, line 27, replace "toe" with -- the --

In the specification, column 9, line 38, replace "toe" with -- the --